(12) United States Patent
Oh et al.

(10) Patent No.: US 12,283,494 B2
(45) Date of Patent: Apr. 22, 2025

(54) SUBSTRATE TRANSFERRING APPARATUS

(71) Applicant: RORZE SYSTEMS CORPORATION, Yongin-si (KR)

(72) Inventors: Seung Bae Oh, Yongin-si (KR); Masahiko Uchiyama, Yongin-si (KR); Suk Jun Lee, Yongin-si (KR); Kwan Young Cho, Yongin-si (KR)

(73) Assignee: RORZE SYSTEMS CORPORATION, Yongin-si (KR)

( * ) Notice: Subject to any disclaimer, the term of this patent is extended or adjusted under 35 U.S.C. 154(b) by 971 days.

(21) Appl. No.: 16/940,974

(22) Filed: Jul. 28, 2020

(65) Prior Publication Data

US 2021/0050230 A1 Feb. 18, 2021

(30) Foreign Application Priority Data

Aug. 14, 2019 (KR) .................. 10-2019-0099610

(51) Int. Cl.
*H01L 21/67* (2006.01)
*H01L 21/677* (2006.01)

(52) U.S. Cl.
CPC .. *H01L 21/67017* (2013.01); *H01L 21/67769* (2013.01); *H01L 21/67772* (2013.01)

(58) Field of Classification Search
CPC ......... H01L 21/67017; H01L 21/67769; H01L 21/67772; H01L 21/324; H01L 21/677; H01L 21/02; H01L 21/67703; H01L 21/67; H01L 21/67011
USPC .......................................................... 454/184
See application file for complete search history.

(56) References Cited

U.S. PATENT DOCUMENTS

| 2018/0040493 | A1* | 2/2018 | Kawai ..................... B65G 49/07 |
| 2018/0148834 | A1* | 5/2018 | Kamimura ............ C23C 16/4584 |
| 2020/0135523 | A1* | 4/2020 | Reuter .............. H01L 21/67766 |

FOREIGN PATENT DOCUMENTS

| CN | 112970099 | 6/2021 |
| JP | 2001-319915 | 11/2001 |
| TW | 201620020 | 6/2016 |
| WO | 2018-167846 | 9/2018 |

OTHER PUBLICATIONS

Reuter, Paul, 62-751514 Specification.pdf, "Front-ducted equipment front end modules, side storage pods, and methods of operating the same", Oct. 2018, pp. 1-25.*

* cited by examiner

*Primary Examiner* — Avinash A Savani
*Assistant Examiner* — Ryan L Faulkner
(74) *Attorney, Agent, or Firm* — KILE PARK REED & HOUTTEMAN PLLC

(57) ABSTRACT

A substrate transferring apparatus capable of reducing a nitrogen gas for purging and a shutdown time thereof. The Substrate transferring apparatus includes a ventilation driving room, a FOUP receiving room, a driving equipment room and a ventilation duct. The ventilation driving room is equipped with a main fan for blowing air downward. The FOUP receiving room is disposed under the ventilation driving room and accommodates a FOUP for storing a substrate. The driving equipment room is disposed under the FOUP receiving room. The ventilation duct connects the FOUP receiving room and the ventilation driving room.

2 Claims, 4 Drawing Sheets

SUBSTRATE TRANSFERRING APPARATUS

CROSS REFERENCE TO RELATED APPLICATION

This application claims priority from and the benefit of Korean Patent Applications No. 10-2019-0099610, filed on Aug. 14, 2019, which is hereby incorporated by reference for all purposes as if fully set forth herein.

BACKGROUND OF THE INVENTION

Field of the Invention

The present invention relates to a substrate transferring apparatus, and more particularly, to a substrate transferring apparatus for carrying a wafer between a wafer storage container and a processing equipment.

Discussion of the Background

A semiconductor device is manufactured through various processes on a silicon substrate, which is a wafer. In manufacturing semiconductor devices, high integration and circuit miniaturization are gradually progressing, and it is required to maintain a high degree of cleanliness around the wafer to prevent particles or moisture from adhering to the wafer surface. In addition, the manufacturing process of the semiconductor device is performed under nitrogen gas atmosphere or in vacuum to prevent surface characteristics change of the wafer such as oxidation.

In order to properly maintain the atmosphere around the wafer, the wafer is managed inside a sealed containment pod called a Front-Opening Unified Pod (FOUP), which is filled with nitrogen. In addition, a substrate transferring apparatus called an EFEM (Equipment Front End Module) is used in order to transfer the wafer between a processing apparatus for processing the wafer and the FOUP.

FIG. 1 is a cross-sectional view showing a conventional substrate transferring apparatus.

Referring to FIG. 1, a conventional substrate transferring apparatus 100 includes a ventilation driving room 110, a FOUP receiving room 120, a driving equipment room 130, and a ventilation duct 150.

In the ventilation driving room 110, a main fan 140 is provided to blow nitrogen gas (or air) downward to clean the inside of the substrate transferring apparatus 100.

The nitrogen gas is blown downward through the FOUP receiving room 120 to the driving equipment room 130, and inflows through the ventilation duct 150 connecting a first opening portion (A) formed at a lower portion of a driving equipment room 130, and a second opening portion (B) formed at an upper portion of a ventilation driving room 110.

That is, ventilation is performed in a large area up to the driving equipment room 130 where ventilation is unnecessary, and accordingly, the amount of nitrogen gas required is increased and a shutdown time of the equipment is increased.

SUMMARY OF THE INVENTION

Accordingly, the problem to be solved by the present invention is to provide a substrate transferring apparatus that can reduce the required amount of nitrogen gas and shutdown time of equipment.

A Substrate transferring apparatus according to an exemplary embodiment includes a ventilation driving room, a FOUP receiving room, a driving equipment room and a ventilation duct. The ventilation driving room is equipped with a main fan for blowing air downward. The FOUP receiving room is disposed under the ventilation driving room and accommodates a FOUP for storing a substrate. The driving equipment room is disposed under the FOUP receiving room. The ventilation duct connects the FOUP receiving room and the ventilation driving room.

For example, the FOUP receiving room may comprise a first opening portion formed at a lower portion thereof, the ventilation driving room may comprise a second opening portion formed at an upper portion thereof, and a ventilation duct may connect the first opening portion and the second opening portion.

In this case, the substrate transferring apparatus may further comprise a sub fan provided in the first opening portion.

On the other hand, the FOUP receiving room may comprise a door that opens a first side of the FOUP receiving room by descending and closes the one side of the FOUP receiving room by ascending, and the substrate transferring apparatus may further comprise a door receiving room disposed adjacent to the driving equipment room under the first side of the FOUP receiving room, and an exhausting path disposed adjacent to the driving equipment room on a second side of the FOUP receiving room.

In this case, the substrate transferring apparatus may further comprise a connecting path connecting the door receiving room and the exhausting path.

In addition, the substrate transferring apparatus may further comprise a sub valve and a main valve. The sub valve may be provided in the connecting path to open and close the connecting path. The main valve discharges the gas in the exhausting path to outside.

As described above, according to the substrate transferring apparatus according to the present invention, the amount of nitrogen gas required and the shutdown time of equipment can be reduced by excluding the driving equipment room from the ventilation space, which is a space that does not require ventilation.

In addition, compared to the conventional substrate transferring apparatus, it is possible to reduce the rotational speed of the main fan, thereby reducing power consumption.

In addition, when adding a sub fan to the first opening portion formed in the FOUP receiving room, it is possible to induce a smooth flow of nitrogen gas by reducing turbulence in the FOUP receiving room.

In addition, when a door receiving room is formed, the inside of the door receiving room can be purged through a connecting path connecting the door receiving room and the exhausting path, and the introduced particles can be discharged to the outside through the main valve.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 3 is a cross-sectional view showing a state in which the door is closed, and FIG. 4 is a cross-sectional view showing a state in which the door is open.

DETAILED DESCRIPTION OF THE ILLUSTRATED EMBODIMENTS

Figure 1:
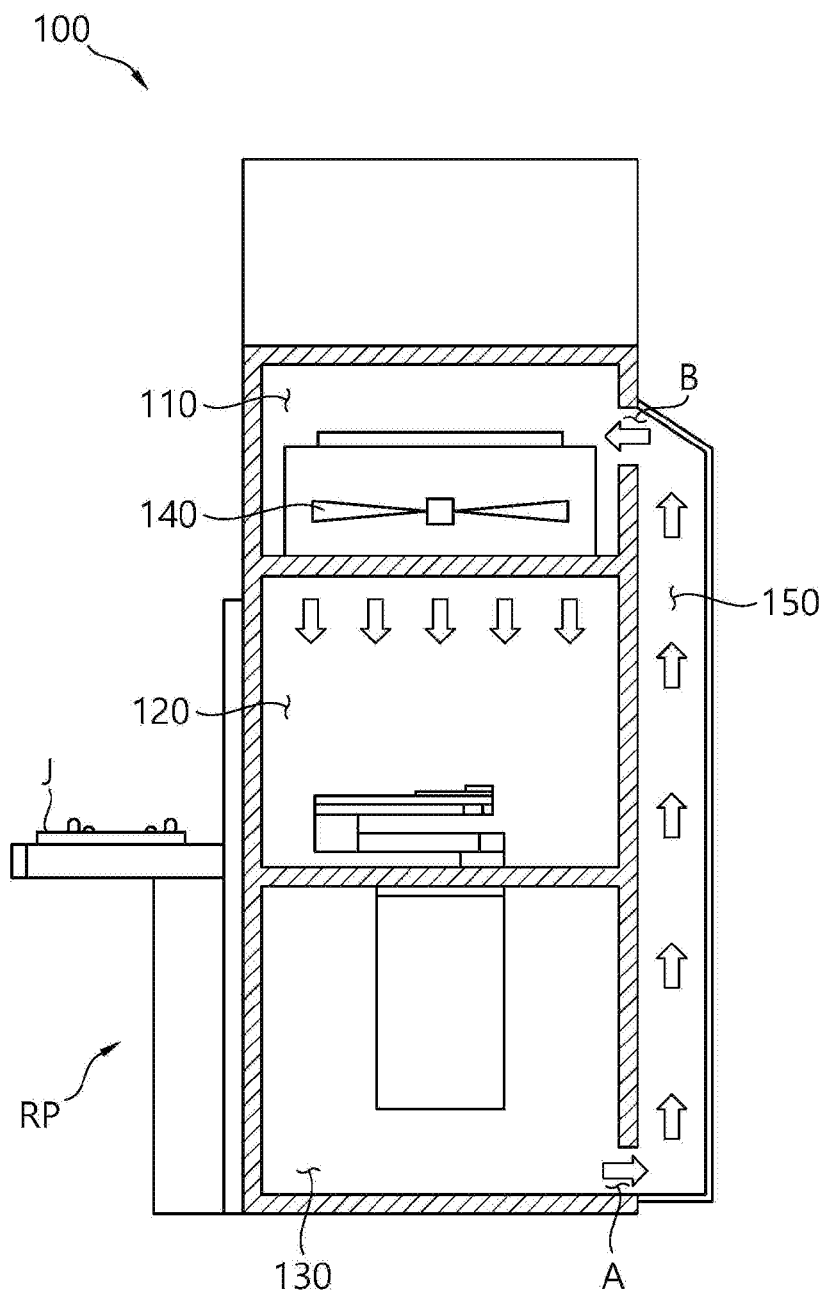
FIG. 1 is a cross-sectional view showing a conventional substrate transferring apparatus.

The present invention may have various changes and may have various forms, and specific embodiments will be illustrated in the drawings and described in detail in the text. However, this is not intended to limit the present invention to a specific disclosure form, it should be understood to include all modifications, equivalents, and substitutes included in the spirit and scope of the present invention. In describing each drawing, similar reference numerals are used for similar components. In the accompanying drawings, the dimensions of the structures may be exaggerated than actual ones for clarity of the present invention.

Terms such as first and second may be used to describe various components, but the components should not be limited by the terms. The terms are used only for the purpose of distinguishing one component from other components. For example, the first component may be referred to as a second component without departing from the scope of the present invention, and similarly, the second component may also be referred to as a first component.

Terms used in the present application are only used to describe specific embodiments, and are not intended to limit the present invention. Singular expressions include plural expressions unless the context clearly indicates otherwise. In this application, terms such as "include" or "have" are intended to indicate the existence of a feature, number, step, operation, component, part, or combination thereof described in the specification, and it should be understood that the existence of one or more addition possibilities of numbers, steps, actions, components, parts or combinations thereof are not excluded in advance. In addition, A and B are 'connected' and 'joined' means not only for direct connection between A and B, but that other component C may be included between A and B to connect or join A and B.

Unless otherwise defined, all terms used herein, including technical or scientific terms, have the same meaning as commonly understood by a person skilled in the art to which the present invention pertains. Terms such as those defined in a commonly used dictionary should be interpreted as having meanings consistent with meanings in the context of related technologies, and should not be interpreted as ideal or excessively formal meanings unless explicitly defined in the present application. In addition, in the claims of a method invention, unless each step is clearly bound to the order, the order of each step may be interchanged with each other.

Hereinafter, exemplary embodiments of the present invention will be described in detail with reference to the accompanying drawings.

Figure 2:
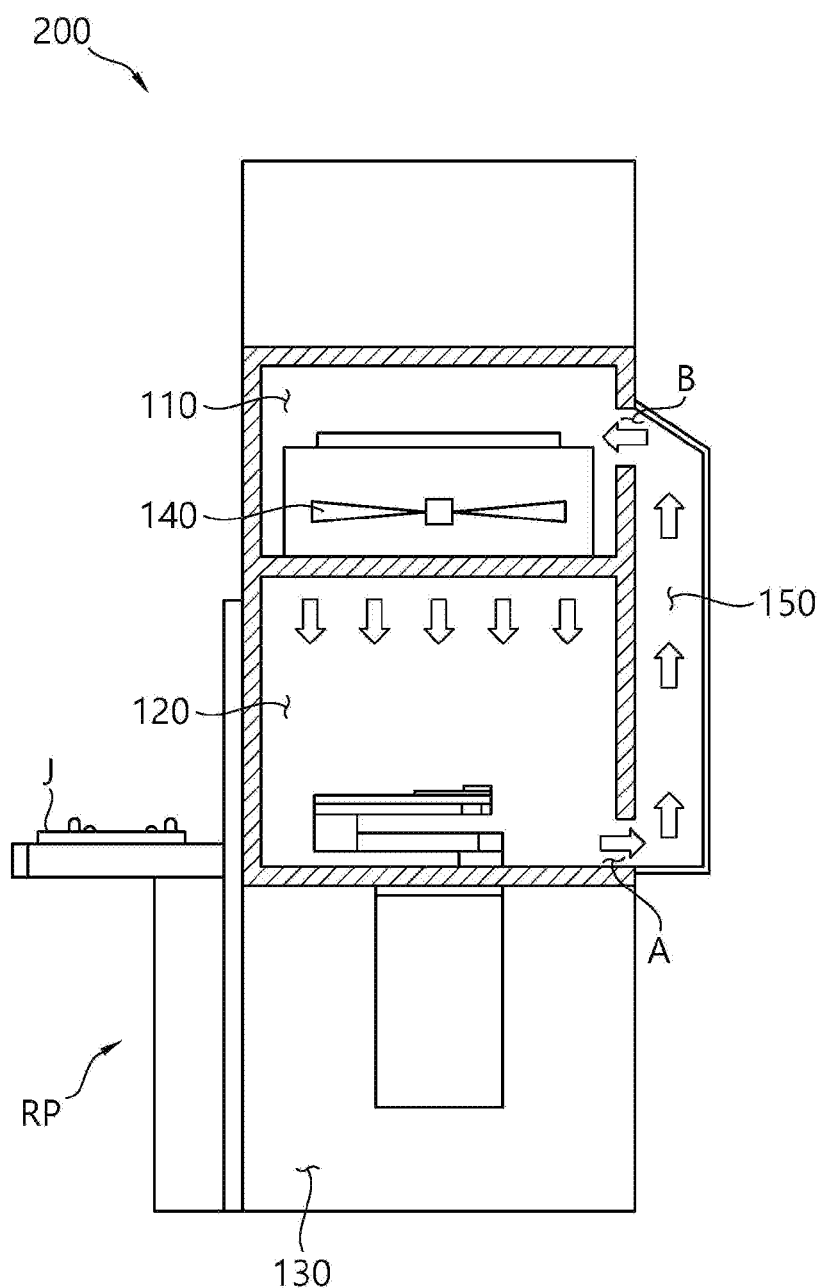
FIG. 2 is a cross-sectional view showing a substrate transferring apparatus according to an exemplary embodiment of the present invention.

FIG. 2 is a cross-sectional view showing a substrate transferring apparatus according to an exemplary embodiment of the present invention.

Referring to FIG. 2, a substrate transferring apparatus 200 according to an exemplary embodiment of the present invention, includes a ventilation driving room 110, a FOUP receiving room 120, a driving equipment room 130 and a ventilation duct 150. A housing of the substrate transferring apparatus 200 is partitioned to form the ventilation driving room 110, the FOUP receiving room 120, and the driving equipment room 130. The driving equipment room 130, the FOUP receiving room 120, and ventilation driving room 110 are sequentially arranged from the bottom.

The ventilation driving room 110 is provided with a main fan 140. The main fan 140 blows air (or nitrogen gas) in a downward direction. On the other hand, in the drawing, the ventilation driving room 110 and the FOUP receiving room 120 are shown as being separated into partitions of a housing, but this is only for convenience. The ventilation driving room 110 and the FOUP receiving room 120 are formed such that air flows from the from the ventilation driving room 110 to the FOUP receiving room 120.

The FOUP receiving room 120 is disposed under the ventilation driving room 110 and accommodates a FOUP for storing a substrate. Although not shown, the FOUP receiving room 120 is provided with a door. Through this door (not shown), the FOUP disposed on the top of the jig J of the load port RP may be transferred into the FOUP receiving room 120.

At this time, the door (not shown) can be opened by rising toward the ventilation driving room 110, and closed by returning back to the FOUP receiving room 120. On the other hand, the substrate transferring apparatus 100 shown in FIGS. 3 and 4 may be opened as the door descends to the lower driving equipment room 130, and may be closed by returning back to the FOUP receiving room 120, as in the conventional substrate transferring apparatus. Above example will be described in detail with reference to FIGS. 3 and 4.

The driving equipment room 130 is disposed under the FOUP receiving room 120. In the driving equipment room 130, facilities for driving a substrate transferring apparatus may be provided.

The ventilation duct 150 connects the FOUP receiving room 120 and the ventilation driving room 110. For example, the FOUP receiving room 120 includes a first opening portion (A) formed at a lower portion thereof, and the ventilation driving room 110 includes a second opening portion (B) formed at an upper portion thereof, and the ventilation duct 150 may connect the first opening portion (A) and the second opening portion (B).

On the other hand, in FIG. 2, the ventilation duct 150 is shown as formed on the opposite side (eg, back) of the load port RP, but is not limited thereto. That is, the ventilation duct 15 may be formed on the side.

Figure 3:
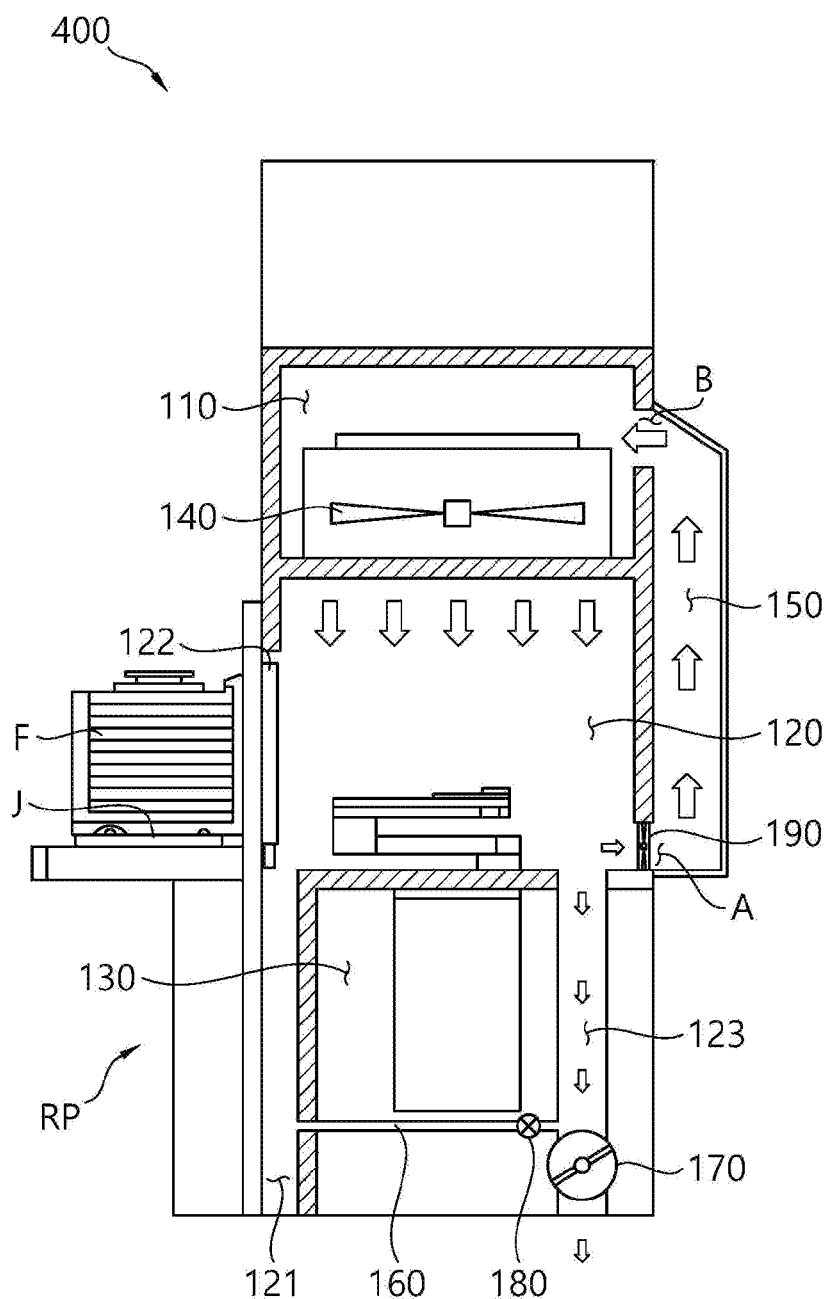
FIG. 3 and FIG. 4 is a cross-sectional view showing a substrate transferring apparatus according to another exemplary embodiment of the present invention.
Figure 4:
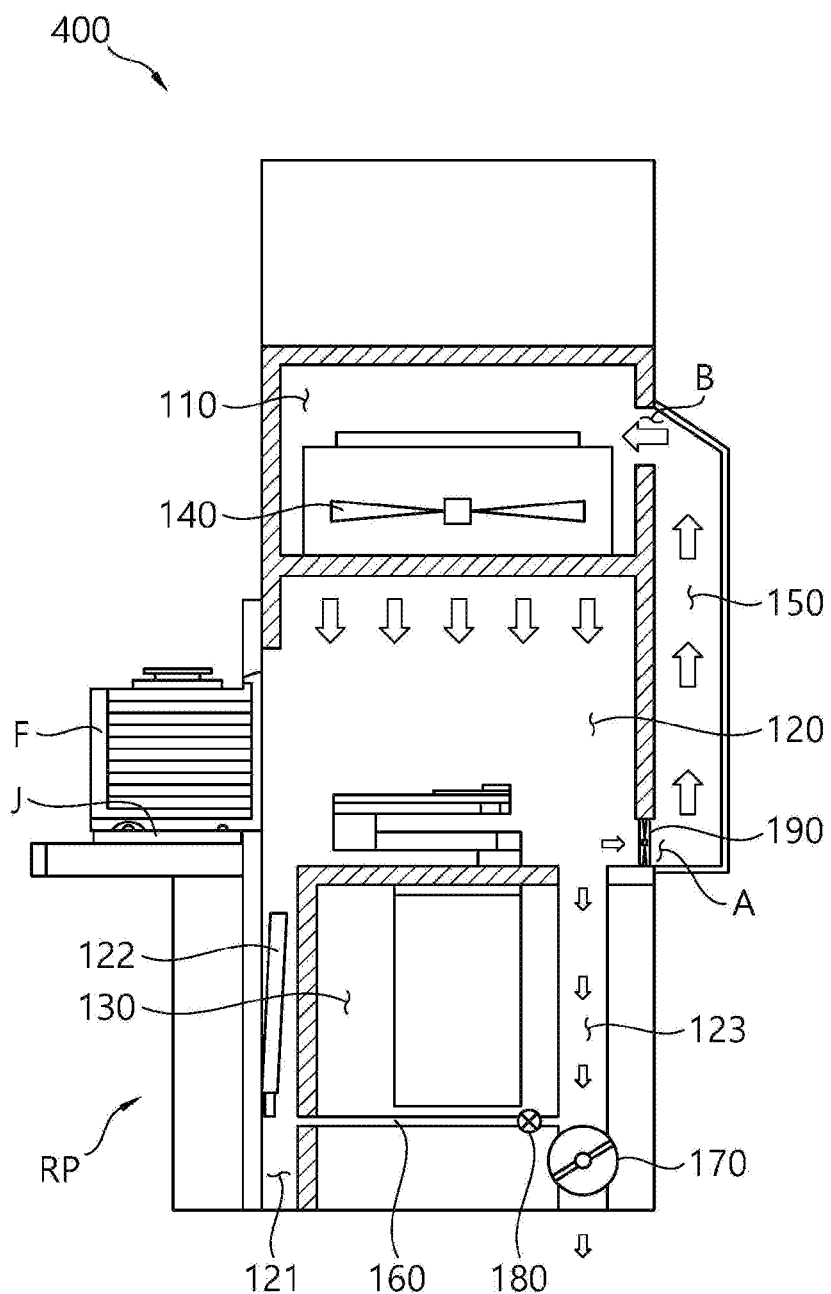

The substrate transferring apparatus 200 may further include a sub fan 190 provided in the first opening portion (A) as shown in FIGS. 3 and 4. This sub fan 190 will be described in more detail with reference to FIG. 3.

FIG. 3 and FIG. 4 is a cross-sectional view showing a substrate transferring apparatus according to another exemplary embodiment of the present invention, FIG. 3 is a cross-sectional view showing a state in which the door is closed, and FIG. 4 is a cross-sectional view showing a state in which the door is open. The substrate transferring apparatus 400 according to another embodiment of the present invention disclosed in FIGS. 3 and 4, has a door descending downward to open and ascending upward to close the FOUP receiving room 120 as in the conventional substrate transferring apparatus 100 so that the substrate transferring apparatus 400 has complex configuration, compared to the substrate transferring apparatus 200 of FIG. 2. Components illustrated in FIGS. 3 and 4, which are similar to those of the substrate transferring apparatus 200 illustrated in FIG. 2, are denoted by the same reference numerals, and repetitive descriptions are omitted.

Referring to FIGS. 3 and 4, the substrate transferring apparatus 400 according to another exemplary embodiment of the present invention includes a ventilation driving room 110, a FOUP receiving room 120, a driving equipment room 130, and a ventilation duct. 150.

According to the substrate transferring apparatus 400 of the present invention, the FOUP receiving room 120 includes a door 122 that opens and closes one side of the FOUP receiving room 120 by descending downward and ascending upward. The substrate transferring apparatus 400 may further include the door receiving room 121 and the exhausting path 123.

The door receiving room 121 is disposed adjacent to the driving equipment room 130 under the one side of the FOUP receiving room 120.

The exhausting path 123 is disposed adjacent to the driving equipment room 130 on the other side of the FOUP receiving room 120.

In this case, the substrate transferring apparatus 400 may further include a connecting path 160 connecting the door receiving room 121 and the exhausting path 123. Through this connecting path 160, air inside the door receiving room 121 may be guided to the exhausting path 123, and particles introduced through the exhausting path 123 may be discharged.

In addition, the substrate transferring apparatus 400 may further include a sub valve 180 and a main valve 170.

The sub valve 180 is provided in the connecting path 160 to open and close the connecting path 160. The main valve 170 may discharge the gas of the exhausting path 123 to the outside.

When the main fan 140 provided inside the ventilation driving room 110 is driven, the sub valve 180 and the main valve 170 may be opened. In this case, it is preferable that the main valve 170 is slightly opened.

In addition, when the main fan 140 is normally driven, the sub valve 180 and/or the main valve 170 are/is closed and intermittently opened to discharge particles inside the substrate transferring apparatus 400. In addition, when the sub valve 180 and/or the main valve 170 are/is closed during normal operation of the main fan 140, only one sides of the door receiving room 121 and the exhausting path 123 are opened and the other side of the door receiving room 121 and the exhausting path 123 are closed, so that there is no space for air to flow inward. Therefore, the air is circulated only in the ventilation driving room 110 and the FOUP receiving room 120, like the substrate transferring apparatus 200 shown in FIG. 2.

As described above, according to the substrate transferring apparatuses 200 and 400 according to the present invention, the driving equipment room 130 requiring no ventilation is excluded from ventilation space so that nitrogen gas for ventilation and shutdown time may be reduced.

In addition, compared to the prior art, it is possible to reduce the rotational speed of the main fan 140, thereby reducing power consumption. That is, in order to blow air to the FOUP accommodated in the FOUP receiving room 120 in a certain strength, the rotational speed of the main fan 140 can be relatively reduced. In the conventional substrate transferring apparatus 100, since the air is circulated to the driving equipment room 130, the rotation speed of the main fan 140 should be relatively high, but in the substrate transferring apparatuses 200 and 400 according to the present invention, since the air circulates only up to the FOUP receiving room 120, the rotational speed of the main fan 140 can be relatively reduced.

It will be apparent to those skilled in the art that various modifications and variation may be made in the present invention without departing from the spirit or scope of the invention. Thus, it is intended that the present invention cover the modifications and variations of this invention provided they come within the scope of the appended claims and their equivalents.

What is claimed is:

1. A substrate transferring apparatus comprising:
a ventilation driving room equipped with a main fan for blowing air downward;
a FOUP receiving room disposed under the ventilation driving room and accommodating a FOUP for storing a substrate;
a driving equipment room disposed under the FOUP receiving room;
an exhausting path disposed adjacent to the driving equipment room on a first side of the FOUP receiving room;
a door that opens a second side of the FOUP receiving room by descending and closes the one side of the FOUP receiving room by ascending:
a door receiving room disposed adjacent to the driving equipment room under the side of the FOUP receiving room, such that the driving equipment room is disposed between the door receiving room and the exhausting path;
a connecting path connecting the door receiving room and the exhausting path across the driving equipment room; and
a ventilation duct connecting the FOUP receiving room and the ventilation driving room, wherein
the FOUP receiving room comprises a first opening portion formed at a lower portion thereof,
the ventilation driving room comprises a second opening portion formed at an upper portion thereof,
the ventilation duct connects the first opening portion and the second opening portion,
a sub fan is disposed in the first opening portion adjacent the exhausting path and the FOUP receiving room, with the sub fan being configured to direct airflow to the ventilation duct, and
the driving equipment room requires no ventilation and is excluded from ventilation space.

2. The substrate transferring apparatus of claim 1, further comprising:
a sub valve provided in the connecting path to open and close the connecting path; and
a main valve for discharging the gas in the exhausting path to outside.

* * * * *